(12) United States Patent
Chien et al.

(10) Patent No.: US 7,872,506 B2
(45) Date of Patent: Jan. 18, 2011

(54) GATE DRIVER AND METHOD FOR MAKING SAME

(75) Inventors: Chih Yuan Chien, Hsinchu (TW); Tsung-Ting Tsai, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 68 days.

(21) Appl. No.: 12/291,006

(22) Filed: Nov. 4, 2008

(65) Prior Publication Data

US 2010/0109738 A1  May 6, 2010

(51) Int. Cl.
   *H03K 3/00* (2006.01)
(52) U.S. Cl. ...................................... 327/108
(58) Field of Classification Search ................ 377/79
   See application file for complete search history.

(56) References Cited

U.S. PATENT DOCUMENTS

| | | | |
|---|---|---|---|
| 6,417,830 B1 | 7/2002 | Byeon, II | 345/99 |
| 6,549,186 B1 | 4/2003 | Kwon | 345/95 |
| 6,573,881 B1 | 6/2003 | Kwon | 345/92 |
| 7,327,338 B2 | 2/2008 | Moon | 345/87 |
| 2005/0220262 A1 | 10/2005 | Moon | 377/64 |
| 2008/0143759 A1 | 6/2008 | Chien et al. | 345/698 |
| 2008/0174580 A1 | 7/2008 | Chang et al. | 345/205 |
| 2008/0198290 A1 | 8/2008 | Su et al. | 349/48 |
| 2008/0285705 A1* | 11/2008 | Wei et al. | 377/78 |

FOREIGN PATENT DOCUMENTS

| | | |
|---|---|---|
| CN | 1921018 A | 2/2007 |
| CN | 101114525 A | 1/2008 |
| CN | 101252022 A | 8/2008 |

* cited by examiner

*Primary Examiner*—Lincoln Donovan
*Assistant Examiner*—Daniel Rojas
(74) *Attorney, Agent, or Firm*—Ware, Fressola, Van Der Sluys and Adolphson, LLP

(57) ABSTRACT

A gate driver for use in a liquid crystal display has a plurality of shift registers connected in series. Each of the shift registers is used to provide a gate-line pulse to a row of pixels in the liquid crystal display. The gate-line pulse has a front pulse and a rear pulse and the shift register has a front-pulse generating part and a rear-pulse generating part for generating to corresponding pulse. Each of the pulse generating parts has a first pull-up circuit to generate a voltage level to keep a switching element in a second pull-up circuit conducting so as to generate a front or rear pulse, in response to a corresponding clock signal, and two pull-down circuits, in response to the voltage level, to allow the front or rear pulse to be generated only at a pull-down period.

15 Claims, 7 Drawing Sheets

_US 7,872,506 B2_

GATE DRIVER AND METHOD FOR MAKING SAME

FIELD OF THE INVENTION

The present invention relates generally to a gate driver for use in a liquid crystal display and, more particularly, to a gate driver circuit having a series of shift registers.

BACKGROUND OF THE INVENTION

As known in the art, a color liquid crystal display (LCD) panel 1 has a two-dimensional array of pixels 10, as shown in FIG. 1. Each of the pixels comprises a plurality of sub-pixels, usually in three primary colors of red (R), green (G) and blue (B). These RGB color components can be achieved by using respective color filters. The array of pixels 10 is organized in rows and columns and a plurality of gate lines are used to select or activate the pixels in the rows and a plurality of data lines are used to provide data to the pixels in the columns. Thus, the LCD panel 1 is generally has a gate driver 300 to provide gate-line signals in the gate-lines and a data driver 200 to provide data signals to the data lines.

In some LCD panels, each color sub-pixel has two sub-pixel segments. As shown in FIG. 2, each pixel 10 has two red sub-pixel segments 12*a*, 12*b*; two green sub-pixel segments 14*a*, 14*b*; and two red sub-pixel segments 16*a*, 16*b* on the same row. While one sub-pixel segment is selected or turned on by a gate-line signal in one gate line, the other sub-pixel segment is selected or turned on by the combination of gate line signals in two gate lines. As illustrated in FIG. 2, the sub-pixel segment 12*b* is selected by the gate line signal in gate line G1 on Row 1, whereas the sub-pixel segment 12*a* is selected by the combination of the gate line signal in gate line G1 and the gate line signal in gate line G2 in Row 2. The data lines D1, D2, D3 provide data signals only to sub-pixel segments 12*b*, 14*b* and 16*b*. The electrode of the sub-pixel segment 12*a* in a row is connected to the electrode of the sub-pixel segment 12*b* in the next row. The electrode of the sub-pixel segment 14*a* in a row is connected to the electrode of the sub-pixel segment 14*b* in the next row. The electrode of the sub-pixel segment 16*a* in a row is connected to the electrode of the sub-pixel segment 16*b* in the next row.

In such an LCD panel, the gate line signal in each gate line includes a front-pulse and a rear pulse as shown in FIG. 3.

As shown in FIG. 3, the rear pulse is two times longer than the front pulse. The front pulse in gate line G2 occurs in the first half of the rear pulse in gate line G1. The front pulse in gate line G3 in Row 3 occurs in the first half of the rear pulse in gate line G2, and so on. The special waveform in the data signals in data lines D1, D2, etc. is designed to improve the visual effect, known as color washout, in a liquid crystal display. The arrangement of the sub-pixel segments and the control transistors is known as a multi-switch architecture

SUMMARY OF THE INVENTION

The present invention provides a gate driver and a method for making same. The gate driver is used for providing gate-lines signals in the gate-lines in a liquid crystal display (LCD) panel. In particular, the gate-line signal in each gate line includes a front-pulse and a rear pulse. The gate line signals are particular useful in an LCD panel using a multi-switch architecture. The present invention uses a gate-on-array (GOA) circuit to implement the multi-switch waveform, for example.

Thus, the first aspect of the present invention is an electronic circuit for generating a signal pulse comprising a front pulse and a rear pulse in a non-overlapping manner in reference to a reference signal, the circuit comprising:

a front-pulse generating part for generating the front pulse; and a rear-pulse generating part for generating the rear pulse, wherein the front-pulse generating part is configured to receive a front start pulse and a series of first clock signals, the front-pulse generating part comprising:

a first pull-up circuit for providing a first signal in a first state in reference to the reference voltage in response to the front start pulse;

a second pull-up circuit to at least maintain the first signal in the first state; and a first pull-down circuit for providing a second signal in response to the first signal, wherein the second signal is in a pulled-down state in reference to the reference voltage when the first signal is in the first state, and wherein the second pull-up circuit is further configured to receive the first clock signals in order to provide the front pulse in response to the first clock signals while the second signal is in the pulled-down state; and wherein the rear-pulse generating part is configured to receive a rear start pulse and a series of second clock signals, the rear-pulse generating part comprising:

a first pull-up circuit for providing a first signal in a first state in reference to the reference voltage in response to the rear start pulse;

a second pull-up circuit to at least maintain the first signal in the first state; and a first pull-down circuit for providing a second signal in response to the first signal, wherein the second signal is in a-pulled down state in reference to the reference voltage when the first signal is in the first state, and wherein the second pull-up circuit is further configured to receive the second clock signals in order to provide the rear pulse in response to the second clock signals while the second signal is in the pulled down state.

The front-pulse generating part further comprises:

a second pull-down circuit configured to receive the second signal of the front-pulse generating part, wherein the pull-up circuit is connected to the second pull-down circuit in series such that the front pulse is provided in response to the first clock signals only when the second signal is in the pull-down state.

The rear-pulse generating part further comprises:

a second pull-down circuit configured to receive the second signal of the rear-pulse generating part, wherein the pull-up circuit is connected to the second pull-down circuit in series such that the rear pulse is provided in response to the second clock signals only when the second signal is in the pull-down state.

According to the present invention, the front pulse has a pulse length equal to a clock period, the front pulse having a leading edge, and the front start pulse has a first edge leading a second edge, and wherein the leading edge of the front pulse is behind the first edge of the front start pulse by two pulse lengths, and the rear pulse has a leading edge and the rear start pulse has a first edge leading a second edge, wherein the first edge of the rear start pulse is behind the first edge of the front start pulse by two pulse lengths and the leading edge of the rear pulse is behind the first edge of the rear start pulse by two pulse lengths.

According to the present invention, the first pull-up circuit in the front-pulse generating part comprises a switching element having a control end operatively connected to a first switch end for receiving the front start pulse, and a second switch end for providing the first signal of the front-pulse generating part; and the first pull-up circuit in the rear-pulse generating part comprises a switching element having a control end operatively connected to a first switch end for receiving the rear start pulse, and a second switch end for providing the first signal of the front-pulse generating part.

According to the present invention, the second pull-up circuit in the front-pulse generating part comprises a switching element having a control end arranged to receive the first signal of the front-pulse generating part, a first switch end arranged to receive the first clock signals and the second switch end for providing the front pulse at a first node, and wherein the second pull-up circuit in the rear-pulse generating part comprises a switching element having a control end arranged to receive the first signal of the rear-pulse generating part, a first switch end arranged to receive the second clock signals and the second switch end for providing the rear pulse at a second node, wherein the first node is operatively connected to the second node for providing the front pulse and the rear pulse.

According to the present invention, the first pull-down circuit in the front-pulse generating part comprises:
  a capacitor having a first capacitor end arranged to receive the first clock signals, and a second capacitor end;
  a first switching element having a control end connected to the second capacitor end, a first switch end arranged to receive the first signal of the front-pulse generating part, and a second switch end arranged to receive the reference voltage; and
  a second switching element having a control end arranged to receive the first signal of the front-pulse generating part, a first switch end connected to the second capacitor end, and a second switch end arranged to receive the reference voltage, and wherein
the first pull-down circuit in the rear-pulse generating part comprises:
  a capacitor having a first capacitor end arranged to receive the second clock signals, and a second capacitor end;
  a first switching element having a control end connected to the second capacitor end, a first switch end arranged to receive the first signal of the rear-pulse generating part, and a second switch end arranged to receive the reference voltage, and
  a second switching element having a control end arranged to receive the first signal of the rear-pulse generating part, a first switch end connected to the second capacitor end, and a second switch end arranged to receive the reference voltage.

According to the present invention, the second pull-down circuit in the front-pulse generating part comprises a switching element having a control end arranged to receive the second signal of the front-pulse generating part, a first switch end connected to the first node and a second switch end arranged to receive the reference voltage; and the second pull-down circuit in the rear-pulse generating part comprises a switching element having a control end arranged to receive the second signal of the rear-pulse generating part, a first switch end connected to the second node and a second switch end arranged to receive the reference voltage.

According to the present invention, the front-pulse generating part further comprises a resetting circuit connected to the control end of the second pull-up circuit in the front-pulse generating part for causing the first signal of the front-pulse generating part to change from the first state to a different second state after the front-pulse is provided by the second pull-up circuit of the front-pulse generating part; and the rear-pulse generating part further comprises a resetting circuit connected to the control end of the second pull-up circuit in the rear-pulse generating part for causing the first signal of the rear-pulse generating part to change from the first state to a different second state after the rear-pulse is provided by the second pull-up circuit of the rear-pulse generating part.

According to the present invention, when the first signal of the front-pulse generating part is in the second state, the first signal has a voltage level equal to the reference voltage, when the first signal of the front-pulse generating part is in the first state, the first signal has a voltage level higher than the reference voltage, when the first signal of the rear-pulse generating part is in the second state, the first signal has a voltage level equal to the reference voltage, and when the first signal of the rear-pulse generating part is in the first state, the first signal has a voltage level higher than the reference voltage.

In the electronic device, according to the present invention, the switching elements are n-MOS transistors with the control end of the switching element being the gate terminal of the transistor. Accordingly, the first state is a HIGH state and the second state is a LOW state.

In a different embodiment, the switching elements are p-MOS transistors Accordingly, the first state is a LOW state and the second state is a HIGH state.

The second aspect of the present invention is a gate driver for use in a liquid crystal display, the liquid crystal display comprising a plurality of pixels arranged in a plurality of rows, the gate driver comprising a plurality of the gate-line generating circuits connected in series, each of gate-line generating circuits arranged to provide a gate signal pulse to each of the plurality of rows, wherein the gate-line generating circuits comprises a first-stage circuit, a second-stage circuit and a third-stage circuit, and wherein each of the gate-line generating circuits comprises an electronic device as described above.

According to the present invention, the gate driver is connected to a timing control, such that the first-stage circuit is arranged to receive the front start pulse and the rear start pulse from the timing control, and the timing control comprises:
  a first pulse output for providing first pulse signals;
  a second pulse output for providing second pulse signals having complementary phase relation with the first pulse signals;
  a third pulse output for providing third pulse signals; and
  a fourth pulse output for providing fourth pulse signals having complementary phase relation with the third pulse signals; and wherein the first-stage circuit is arranged to receive the first pulse signals for providing the first clock signals in the electronic device in the first-stage circuit and the third pulse signals for providing the second clock signals in the electronic device in the first-stage circuit, the first-stage circuit further comprising:
  a first front carry buffer circuit comprising a switching element having a control end arranged to receive the first signal in the corresponding front-pulse generating part, a first switch end arranged to receive the first clock signals and a second switch end for providing the front start pulse to the second-stage circuit, and
  a first rear carry buffer circuit comprising a switching element having a control end arranged to receive the first signal in the corresponding rear-pulse generating part, a first switch end arranged to receive the second clock signals and a second switch end for providing the rear start pulse to the second-stage circuit;

the second-stage circuit is arranged to receive the second pulse signals for providing the first clock signals in the electronic device in the second-stage circuit and the fourth pulse signals for providing the second clock signals in the electronic device in the second-stage circuit, the second-stage circuit further comprising:

a second front carry buffer circuit comprising a switching element having a control end arranged to receive the first signal in the corresponding front-pulse generating part, a first switch end arranged to receive the first clock signals and a second switch end for providing the front start pulse to the third-stage circuit, and a second rear carry buffer circuit comprising a switching element having a control end arranged to receive the first signal in the corresponding rear-pulse generating part, a first switch end arranged to receive the second clock signals and a second switch end for providing the rear start pulse to the third-stage circuit; and the third-stage circuit is arranged to receive the first pulse signals for providing the first clock signals in the electronic device in the third-stage circuit and the third pulse signals for providing the second clock signals in the electronic device in the third-stage circuit, the first-stage circuit further comprising:

a first front carry buffer circuit comprising a switching element having a control end arranged to receive the first signal in the corresponding front-pulse generating part, a first switch end arranged to receive the first clock signals and a second switch end for providing the front start pulse to a fourth-stage circuit, and a first rear carry buffer circuit comprising a switching element having a control end arranged to receive the first signal in the corresponding rear-pulse generating part, a first switch end arranged to receive the second clock signals and a second switch end for providing the rear start pulse to a fourth-stage circuit.

The third aspect of the present invention is a liquid crystal display comprising a plurality of pixels arranged in a plurality of rows, the display comprising:

a gate driver comprising a plurality of the gate-line generating circuits connected in series, each of gate-line generating circuits arranged to provide a gate signal pulse to each of the plurality of rows, wherein each of the gate-line generating circuits comprises an electronic device as described above.

The fourth aspect of the present invention is a method for generating gate-line signals, each gate-line signals having a front pulse and a rear pulse. The method comprises:

providing a front start pulse;

generating a first front signal in a first state in reference to the reference voltage in response to the front start pulse, generating a second front signal in response to the first front signal, wherein the second front signal is in a pulled-down state in reference to the reference voltage when the first front signal is in the first state, receiving a first clock signal for provide the front pulse while the second front signal is in the pulled-down state;

providing a rear start pulse;

generating a first rear signal in the first state in response to the rear start pulse, generating a second rear signal in response to the first rear signal, wherein the second rear signal is in a pulled-down state in reference to the reference voltage when the first rear signal is in the first state;

receiving a second clock signal for provide the rear pulse while the second rear signal is in the pulled-down state;

causing the first front signal to change from the first state to a second state after the front pulse is provided; and causing the first rear signal to change from the first state to a second state after the rear pulse is provided The present invention will become apparent upon reading the description taken in conjunction with FIGS. 4-6b.

DETAILED DESCRIPTION OF THE INVENTION

Figure 1:
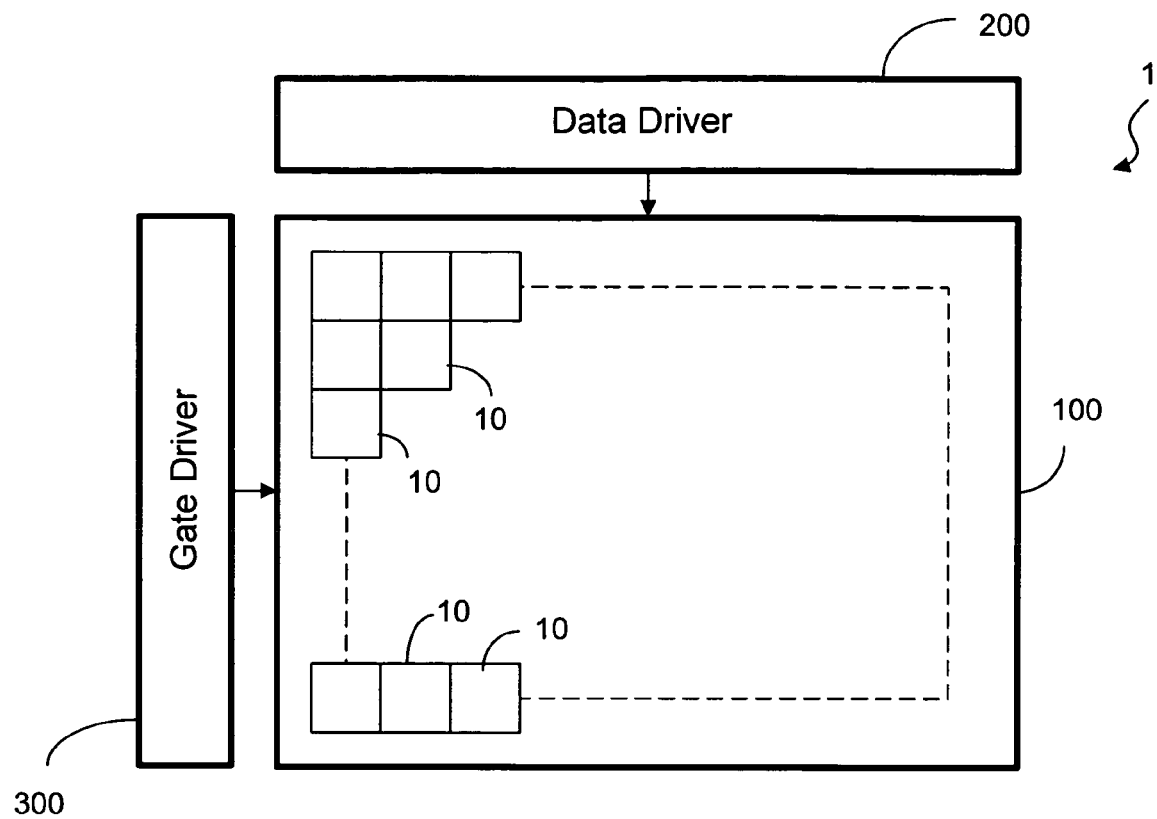
FIG. 1 shows a typical liquid crystal display.
Figure 2:
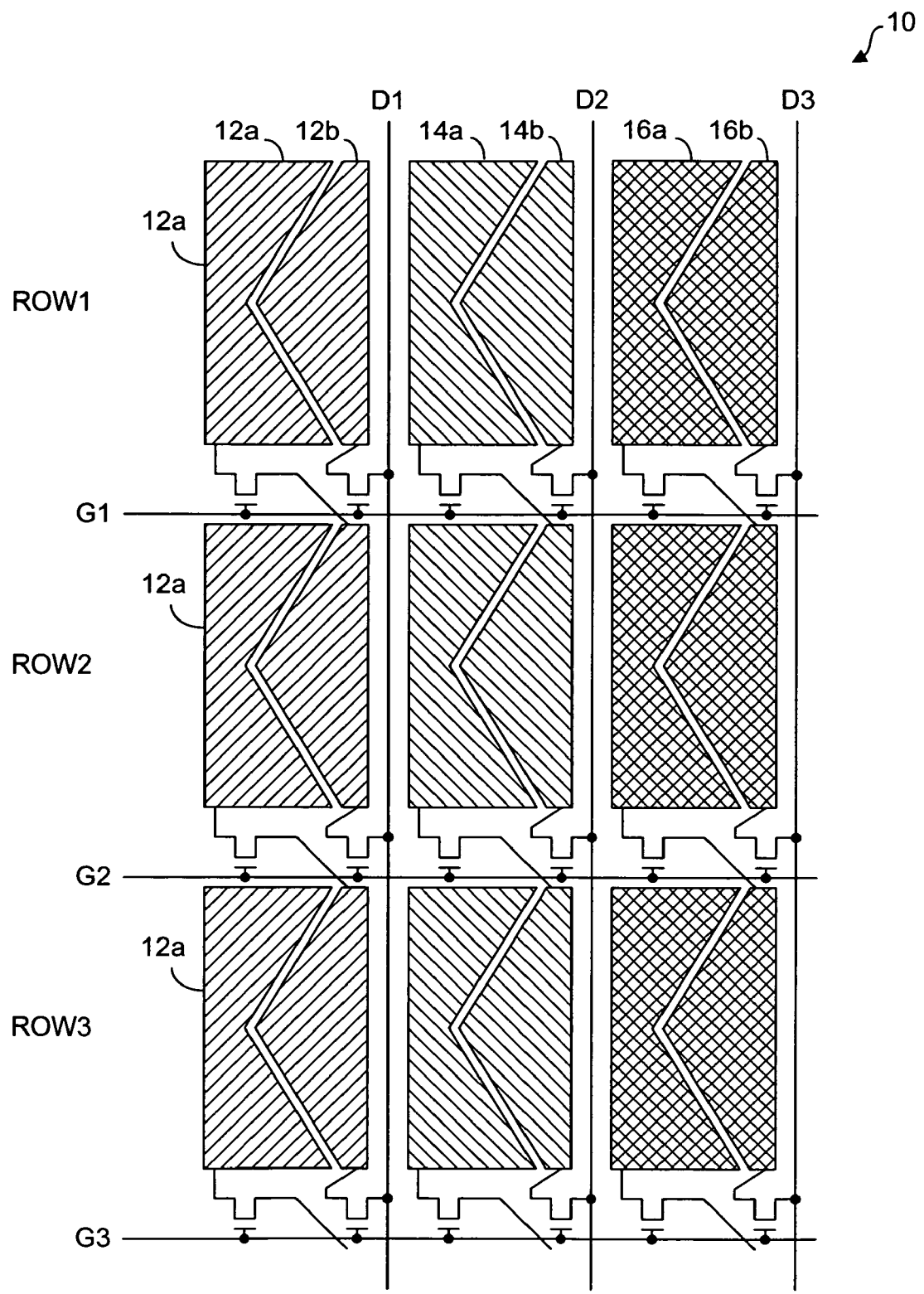
FIG. 2 shows the sub-pixel segments and the control transistors according to gate-on-array technology.
Figure 3:
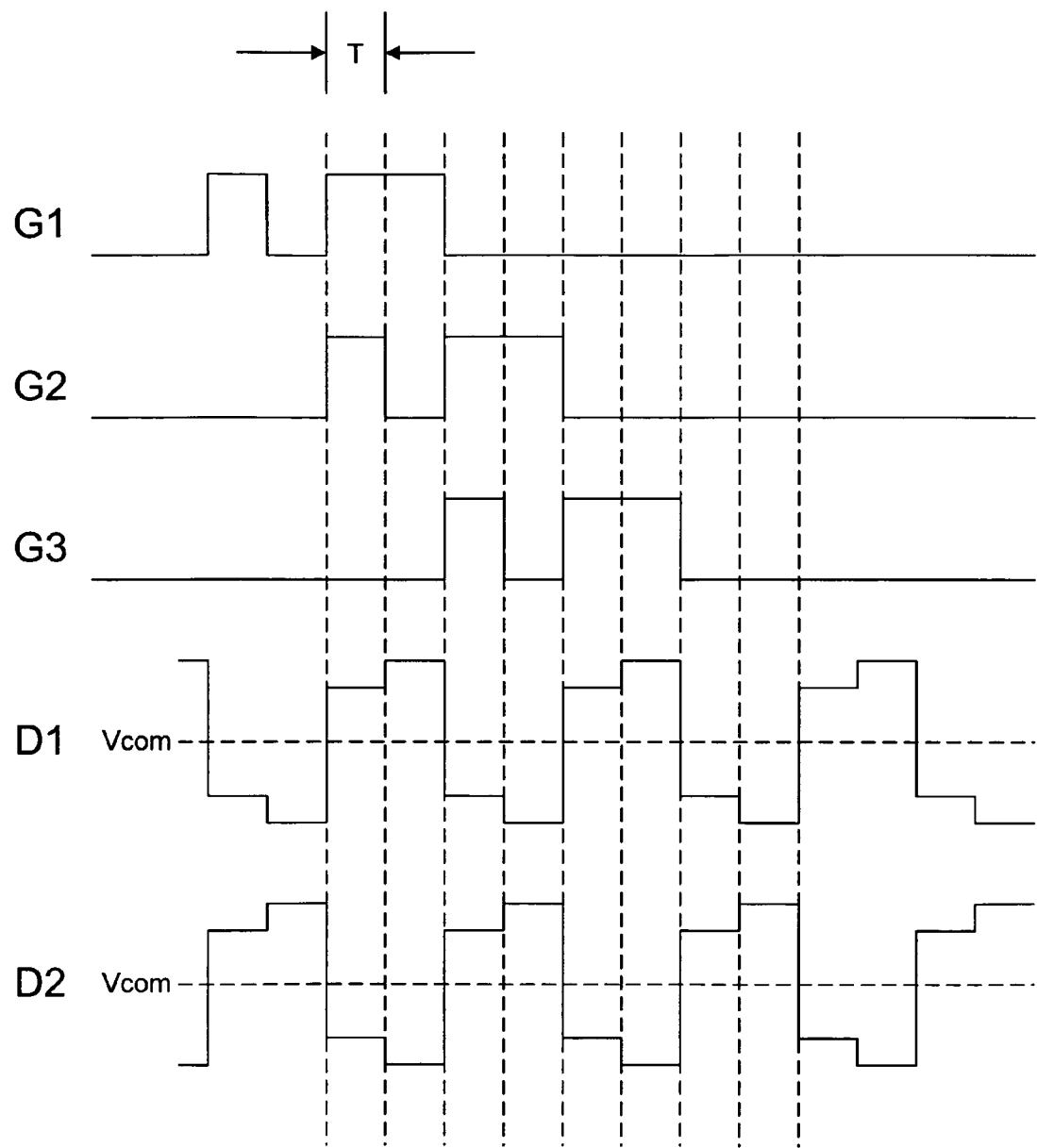
FIG. 3 is a timing chart showing the signal waveforms in gate lines and data lines.

As seen in FIG. 3, the required gate-line signal to select or turn on a pixel row for each frame time comprises a front-pulse and a rear-pulse. In one embodiment of the present invention, the length of the front-pulse is measured in a time unit T and the length of the rear-pulse is equal to 2 T, with a separation of T between the front and rear pulses. Furthermore, the front-pulse of a gate line signal in a gate line occurs at the first half of the rear-pulse of a gate line signal in a preceding gate line. The present invention provides a gate driver having a series of shift registers, wherein each shifter register provides the gate line signals to a gate line.

Figure 4:
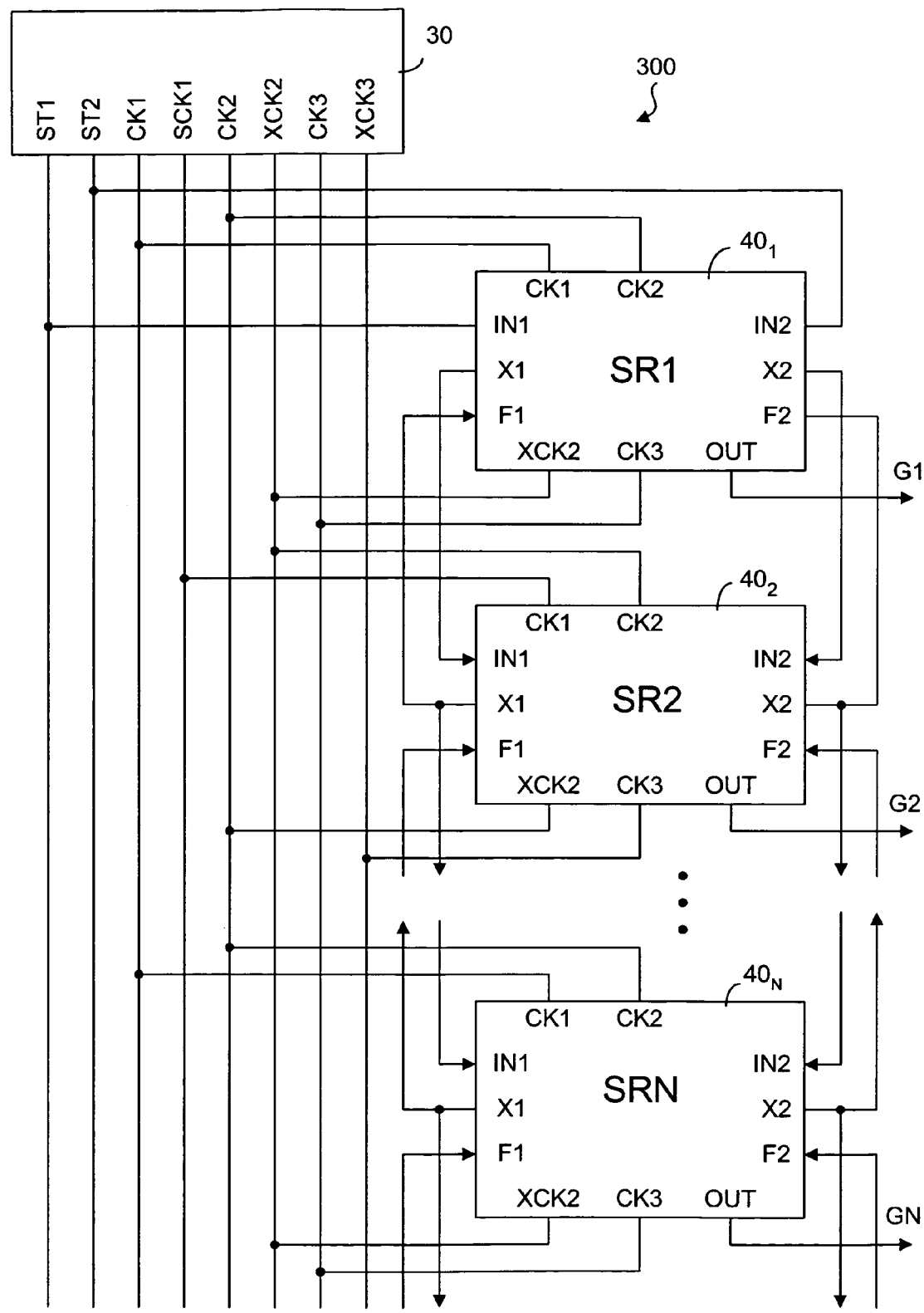
FIG. 4 shows a series of shift registers connected in a cascade fashion to provide the gate line signals, according to the present invention.

The block diagram of the gate driver or generator, according to the present invention, is shown in FIG. 4. As shown in FIG. 4, the gate driver 300 comprises a series of shift registers (SRs) to provide a series of gate line signals in sequential stages, and a timing-control module 30 to control the timing of the shift registers. Each shift register 40 has four clock inputs CK1, CK2, XCK2 and CK3 for receiving clock pulses from the timing control module 30, two start pulse inputs IN1, IN2; one output OUT to provide the gate line signals in one gate line; two carry pulse outputs X1, X2 for providing start pulses to the shift register in the next stage and for providing feedback pulses to the shift register in the previous stage; and two feedback inputs F1, F2 to receive the feedback pulses from the shift register in the next stage. When the shift registers are connected in series in order to provide a series of gate line signals to a plurality of gate lines in sequential stages, only the start pulse inputs IN1, IN2 of the shift register in the first stage receive the start pulses ST1, ST2 from the timing control module 30. The start pulse inputs IN1, IN2 in each of the shift registers in the subsequent stages receive the start pulses from the carry pulse outputs X1, X2 of the shifter register in the preceding stage.

Figure 6A:
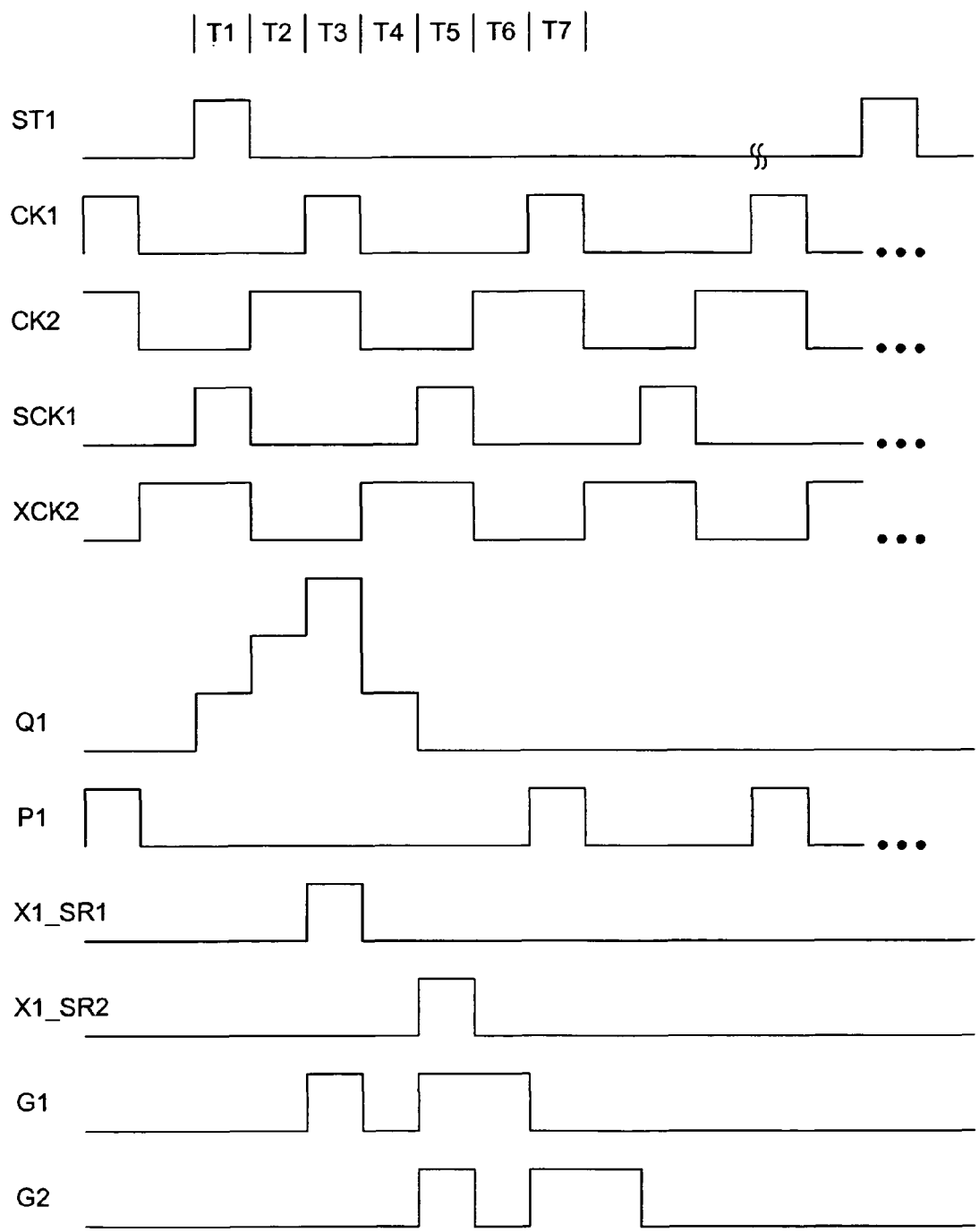
FIGS. 6a and 6b show a timing chart for the signal waveforms in various signal lines, according to the present invention.
Figure 6B:
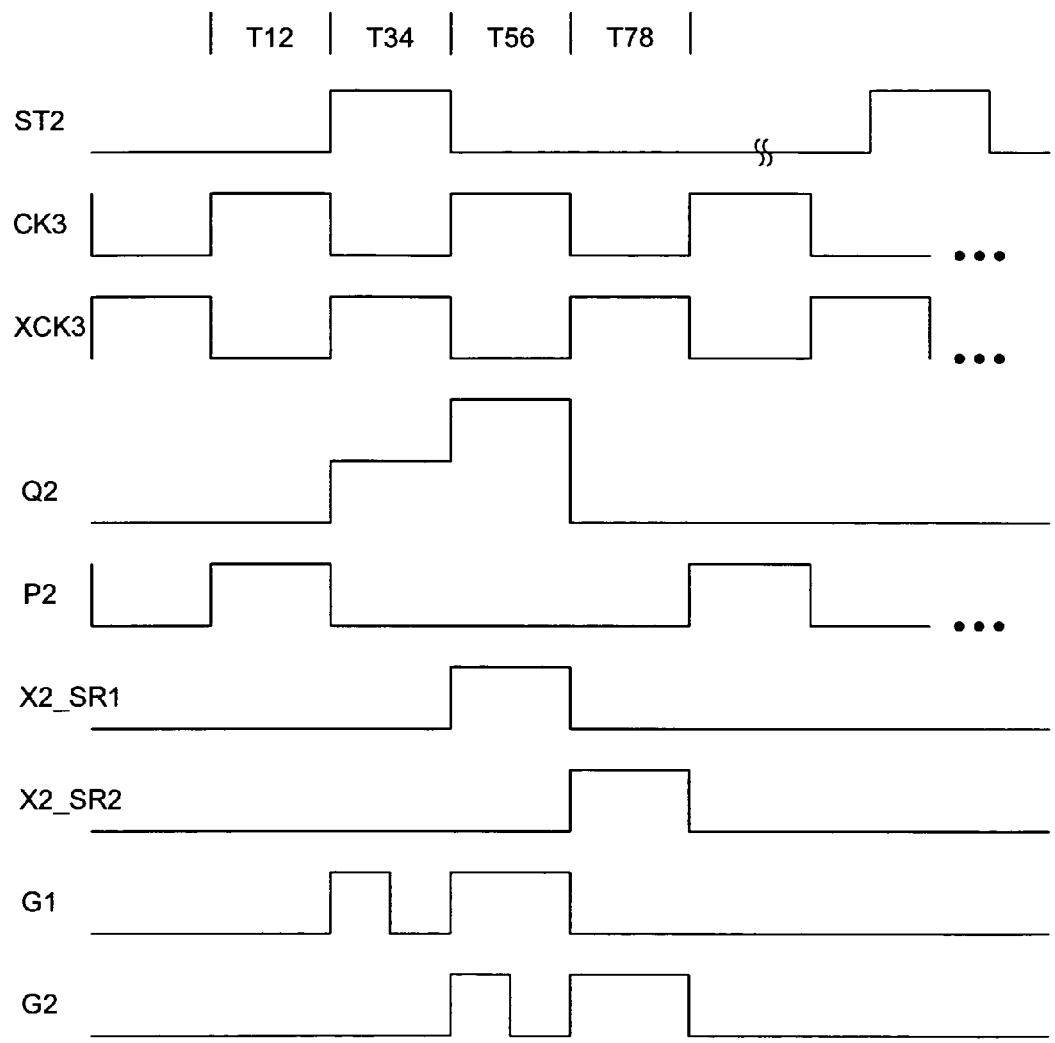

As can be seen from FIGS. 6a and 6b, the length of the front-pulse is measured in a time unit T and the length of the rear-pulse is equal to 2 T, with a separation of T between the front and rear pulses. The length of the start pulse ST1 is T, and the cycle of the start pulse ST1 is related to a frame time. The clock pulse CK1 has a cycle of 4 T and the first clock pulse to start the shift register chain is 2 T behind the start pulse ST1. The front-pulse in the gate line signals in the first gate line (G1) is in sync with the first clock pulse CK1 after the start pulse, and the front-pulse in the gate line signals in the second gate line (G2) is 2 T behind the front-pulse in G1. Thus, while the clock pulse CK1 of the first, third, fifth and other odd-numbered shift registers in the chain is provided by the CK1 output of the timing control module 30, a different clock pulse SCK1 is used to provide the clock pulse CK1 in the second, fourth and other even-numbered shift registers in the chain, wherein the clock pulse SCK1 also has a length of T and is 2 T behind CK1.

The rear-pulse in the gate line signals has a length of 2 T and is separated from the front-pulse by T. The rear-pulse in the first gate line (G1) is in sync with the clock pulse CK3. Thus, the clock pulse CK3 is separated from the clock pulse CK1 by T. Furthermore, the rear-pulse of the second gate line (G2) occurs after the rear-pulse in G1. Thus, while the clock pulse CK3 of the first, third, fifth and other odd-numbered shift registers in the chain is provided by the CK3 output of the timing control module 30, a different clock pulse XCK3 is provided to the clock pulse input CK3 of the second, fourth and other even-numbered shift registers in the chain, wherein the phase of clock pulse XCK3 is complementary to the phase of the clock pulse CK3.

The timing of clock pulse CK2 is related to CK1. As shown in FIG. 6a, CK2 has a length of 2 T and is T ahead of CK1. Thus, while the clock pulse CK2 of the first, third, fifth and other odd-numbered shift registers in the chain is provided by the CK2 output of the timing control module 30, a different clock pulse XCK2 is provided to the clock pulse input CK2 of the second, fourth and other even-numbered shift registers in the chain, wherein the phase of clock pulse XCK2 is complementary to the phase of the clock pulse CK2.

Figure 5:
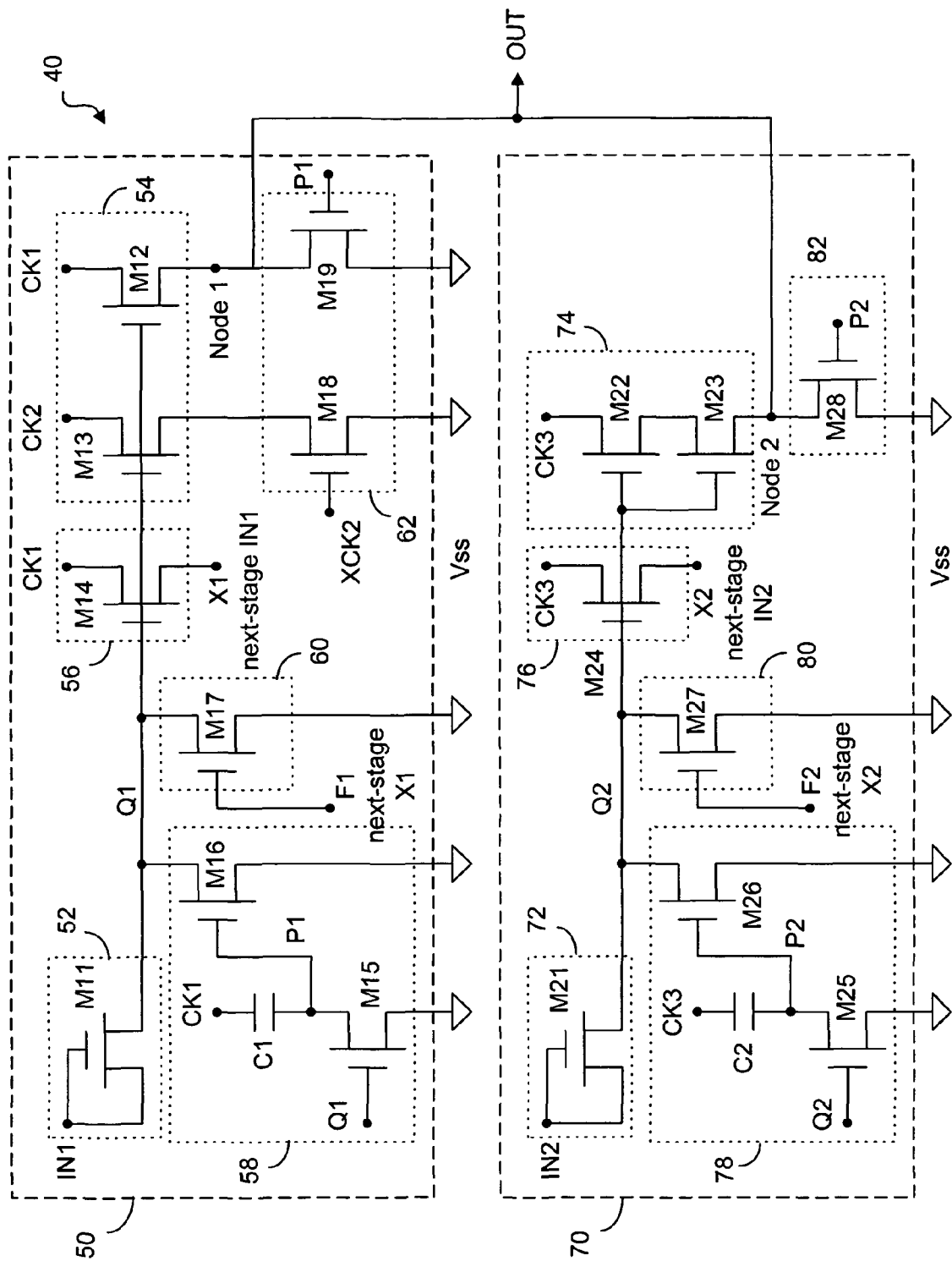
FIG. 5 shows a shift register circuit, according to the present invention.

The shift register 40, according to the present invention, is shown FIG. 5. As shown in FIG. 5, the shift register 40 has two parts, a front-pulse generating part 50 and a rear-pulse generating part 70. They are linked together at Node 1 and Node 2 to produce the gate line signals.

The front-pulse generating part 50 has a first pull-up driving circuit 52 for providing an output Q1 in response to a start pulse (ST1 for the first shift register) received at start pulse input IN1. The first pull-up driving circuit 52 comprises a switching element or TFT M11, with its gate terminal connected to its source terminal. As shown in the timing chart of FIG. 6a, the start pulse ST1 occurs during T1.

The output Q1 is connected to a first pull-down circuit 58 such that the output Q1 is pulled down if the TFT M16 is in a conducting state, or P1 is high. P1 is substantially the same as the voltage level at the clock pulse input CK1 only when the TFT M15 is a non-conducting state or Q1 is low. But when Q1 is high, P1 is always low and TFT M16 is in a non-conducting state. This means the first pull-down driving circuit 58 does not pull down Q1. The first pull-down driving circuit 58 is also used to provide a signal P1 to a second pull-down circuit 62. Q1 is only reset by a feedback circuit 60.

The output Q1 is provided to the gate terminals of a number of switching elements in a parallel pull-up circuit 54 and a carry buffer 56.

The carry buffer 56 comprises a TFT M14 with its source terminal connected to the first clock pulse CK1, and its gate terminal connected to Q1. The drain of TFT M14 is used to provide a start pulse X1 to the start pulse input IN1 of the shift register in the immediately following stage. Since M14 is in a conducting state after the first pull-up driving circuit 52 receives a start pulse ST1, the output at terminal X1 is in sync with the clock pulse CK1 after the start pulse ST1. The output X1 is shown as X1_SR1 in the timing chart of FIG. 6a. As shown in FIG. 6a, the clock pulse CK1 immediately following the start pulse ST1 occurs during T3, and X1_SR1 also occurs during T3. It should be noted that the signal X1_SR1 is provided as a start pulse in the front-pulse generating part in the next shift register.

The parallel pull-up circuit 54 comprises a TFT M12 and a TFT M13 connected in parallel in that their gate terminals are connected together to receive the output Q1 from the first pull-up driving circuit 52. The source terminal of TFT M12 is configured to receive signals from the clock pulse input CK1 and the source terminal of TFT M13 is configured to receive signals from the clock pulse input CK2. The drain terminals of TFT M12 and TFT M13 are connected to the second pull-down driving circuit 62.

The second pull-down driving circuit 62 comprises a TFT M19 connect in series to M12 in the parallel pull-up circuit 54. The gate terminal of TFT M19 is connected to the output P1 of the TFT M15 in the first pull-down driving circuit 58. Since TFT M12 is in a conducting state after the first pull-up driving circuit 52 receives a start pulse ST1, the output at Node 1 is in sync with the clock pulse CK1 after the start pulse ST1 when TFT M19 is non-conducting. The output at Node 1 provides the front-pulse in the gate line signals G1 as shown in the timing chart of FIG. 6a. Thus, the front-pulse in the gate line signals G1 occurs during T3.

The TFT M11 in the first pull-up driving circuit 52 is conducting only when it receives the start pulse ST1 during T1. After the start pulse ST1 has passed, TFT M1 is non-conducting and Q1 is in a floating state. The voltage level of Q1 is affected by the voltage level of CK2 and the voltage level of CK1 via coupling through the parasitic capacitance in TFT M13 and TFT M12. Thus, when CK2 is high and CK1 is low during T2, the voltage level of Q1 is boosted up. During T3, both CK1 and CK2 are high, and the voltage level of Q1 is further increased. During T4, both CK1 and CK2 are low, the voltage level of Q1 resumes the voltage level during T1 until Q1 is reset by the feedback circuit 60 by the next stage X1, or X1_SR2.

As shown in FIG. 6a, X1 of the current stage or X1_SR1 occurs in sync with the clock pulse CK1 immediately after the start pulse ST1. The start pulse ST1 occurs during T1 and X1_SR1 occurs during T3. It should be noted that, in the next register, the clock input to M12 of the parallel pull up circuit 54 and the capacitor C1 in the first pull-down driving circuit 58 is SCK1, and not CK1. Thus, the next stage X1 (X1_SR2) is in sync with the clock pulse SCK1 immediately after the start pulse (X1_SR1) received by the next stage. As shown in FIG. 6a, X1_SR2 occurs during T5. Thus, Q1 of the current stage is reset by X1_SR2 at T5 and remains reset until the next start pulse for the next frame or picture.

The rear-pulse generating part 70 has a first pull-up driving circuit 72 for providing an output Q2 in response to a start pulse (ST2 for the first shift register) received at start pulse input IN2 during the period of T34 as shown in FIG. 6b. The first pull-up driving circuit 72 comprises a switching element or TFT M21, with its gate terminal connected to its source terminal.

The output Q2 is connected to a first pull-down driving circuit 78 such that the output Q2 is pulled down if the TFT M26 is in a conducting state, or P2 is high. P2 is substantially the same as the voltage level at the clock pulse input CK3 only when the TFT M25 is in a non-conducting state or Q2 is low. But when Q2 is high, P2 is always low and TFT M26 is in a non-conducting state. This means the first pull down driving circuit 78 does not pull down Q2. The first pull down driving circuit 78 is used to provide a signal P2 to a second pull-down circuit 82. Q2 is only reset by a feedback circuit 80.

The output Q2 is provided to the gate terminals of a number of switching elements in a series pull-up circuit 74 and a carry buffer 76.

The carry buffer 76 comprises a TFT M24 with its source terminal connected to the clock pulse CK3, and its gate terminal connected to Q2. The drain of TFT M24 is used to provide a start pulse to the start pulse input IN2 of the shift register in a following stage. Since M24 is in a conducting state after the first pull-up driving circuit 72 receives a start pulse ST2, the output at terminal X2 is in sync with the third clock pulse CK3 after the start pulse ST2. The output X2 is in sync with the clock pulse CK3 after the start pulse ST2. The output X2 is shown as X2_SR1 in the timing chart of FIG. 6b. As shown in FIG. 6b, the clock pulse CK3 immediately follows the start pulse ST2 occurs at T56, and X2_SR1 also occurs at T56. It should be noted that the signal X2_SR1 is provided as a start pulse to the rear-pulse generating part 70 in the next register.

The series pull-up circuit 74 comprises a TFT M22 and a TFT M23 connected in series and their gate terminals are connected together to receive the output Q2 from the first pull-up driving circuit 72. The source terminal of TFT M22 is configured to receive signals from the clock pulse input CK3 and the source terminal of TFT M23 is connected to the drain terminal of TFT M22. The drain terminal of TFT M23 is connected to the second pull-down driving circuit 82. The source terminal of TFT M22 is configured to receive signals from the clock signal CK3. The drain terminal of TFT M23 is connected to the second pull down driving circuit 82.

The second pull-down driving circuit 82 comprises a TFT M28 connect in series to M23 in the series pull-up circuit 74. The gate terminal of TFT M28 is connected to the output P2 of the TFT M25 in the first pull-down driving circuit 78. Since TFT M22 and TFT M23 are in a conducting state after the first pull up driving circuit 72 receives a start pulse ST2, the output at Node 2 is in sync with the clock pulse CK3 after the start pulse ST2 when TFT M28 is non-conducting. The output at Node 2 provides the rear-pulse in the gate line signals G1 as shown in the timing chart of FIG. 6a and 6b. Thus, the rear-pulse in the gate line signals G1 occurs at T56, which is corresponding to the time periods T5 and T6 in FIG. 6a.

The TFT M21 in the first pull up driving circuit is conducting only when it received the start pulse ST2 during T34. After the start pulse ST2 has passed, TFT M21 is non-conducting and Q2 is in a floating state. The voltage level of Q2 is affected by the voltage level of CK3 via coupling through the parasitic capacitance in TFT M22 and TFT M23. Thus, when CK3 is high during T56, the voltage level of Q2 is boosted up. Afterward, Q2 is reset by the feedback circuit 80 by the next stage X2 or X2_SR2.

As shown in FIG. 6b, X2 of the current stage or X2_SR1 occurs in sync with the clock pulse CK3 immediately after the start pulse ST2. The start pulse ST2 occurs during T34 and X2_SR1 occurs during T56. It should be noted that, in the next register, the clock input to the series pull up circuit 74 and the capacitor C2 in the first pull down driving circuit, 78 is XCK3, and not CK3. Thus, the next stage X2 (X2_SR2) is in sync with the clock pulse XCK3 immediately after the start pulse (X2_SR1) for the next stage. As shown in FIG. 6b, X2_SR2 occurs during T78. Thus, Q2 of the current stage is reset by X2_SR2 at T78 and remains reset until the next start pulse of the next frame or picture.

In sum, the front pulse X1 of the current stage (X1_SR1) is generated at Node 1 by CK1 at the parallel pull-up circuit 54 conditioned by P1 output of the second pull-down driving circuit 62. P1 is kept LOW by the first pull-down driving circuit 58 when Q1 is HIGH. Q1 is caused to become HIGH by the start pulse ST1 (or IN1) at the first pull-up driving circuit 52 and is kept in the HIGH state by CK2 and CK1 at the parallel pull-up circuit 54. Q1 is reset by the next-stage front pulse X1.

Likewise, the rear pulse X2 of the current stage (X2_SR1) is generated at Node 2 by CK3 at the series pull-up circuit 74 conditioned by P2 output of the second pull-down driving circuit 82. P2 is kept LOW by the first pull-down driving circuit 78 when Q2 is HIGH. Q2 is caused to become HIGH by the start pulse ST2 (or IN2) at the first pull-up driving circuit 70 and is kept in the HIGH state by CK3 at the series pull-up circuit 74. Q2 is reset by the next-stage front pulse X2.

Thus, according to the present invention, the front-pulse generating part 50 uses a first pull-up driving circuit 52 to provide a first signal Q1 in order to pull down a second signal P1 in a first pull-down circuit 58. While P1 is pulled down, a first start pulse CK1 is used to provide a front pulse X1 from the second pull-up circuit 54. Likewise, the rear-pulse generating part 70 uses a first pull-up driving circuit 72 to provide a first signal Q2 in order to pull down a second signal P2 in a first pull down circuit 78. While P2 is pulled-down, a second start pulse CK3 is used to provide a rear pulse X2 at the second (series) pull-up circuit 74.

The present invention provides a gate driver and a method for making same. The gate driver is used for providing gate-lines signals in the gate-lines in a liquid crystal display (LCD) panel. In particular, the gate-line signal in each gate line includes a front-pulse and a rear pulse. The gate line signals are particular useful in an LCD panel using a multi-switch architecture. The present invention uses a gate-on-array (GOA) circuit to implement the multi-switch waveform, for example.

The method of generating gate-line signals, according to the present invention, comprises:

providing a front start pulse;

generating a first front signal in a first state in reference to the reference voltage in response to the front start pulse, generating a second front signal in response to the first front signal, wherein the second front signal is in a pulled-down state in reference to the reference voltage when the first front signal is in the first state, receiving a first clock signal for provide the front pulse while the second front signal is in the pulled-down state;

providing a rear start pulse;

generating a first rear signal in the first state in response to the rear start pulse, generating a second rear signal in response to the first rear signal, wherein the second rear signal is in a pulled-down state in reference to the reference voltage when the first rear signal is in the first state;

receiving a second clock signal for provide the rear pulse while the second rear signal is in the pulled-down state;

causing the first front signal to change from the first state to a second state after the front pulse is provided; and causing the first rear signal to change from the first state to a second state after the rear pulse is provided According to the present invention, the gate driver comprises a plurality of shift registers connected in series, each shift register is arranged for generating a gate-line signal having a front pulse and a rear pulse in a non-overlapping manner in reference to a reference signal, such as Vss. The shift register comprises a front-pulse generating part for generating the front pulse; and a rear-pulse generating part for generating the rear pulse, wherein the front-pulse generating part is configured to receive a front start pulse and a series of first clock signals, the front-pulse generating part comprising:

a first pull-up circuit for providing a first signal in a first state in reference to the reference voltage in response to the front start pulse;

a second pull-up circuit to at least maintain the first signal in the first state; and a first pull-down circuit for providing a second signal in response to the first signal, wherein the second signal is in a pulled-down state in reference to the reference voltage when the first signal is in the first state, and wherein the second pull-up circuit is further configured to receive the first clock signals in order to provide the front pulse in response to the first clock signals while the second signal is in the pulled-down state; and wherein the rear-pulse generating part is configured to receive a rear start pulse and a series of second clock signals, the rear-pulse generating part comprising:

a first pull-up circuit for providing a first signal in a first state in reference to the reference voltage in response to the rear start pulse;

a second pull-up circuit to at least maintain the first signal in the first state; and a first pull-down circuit for providing a second signal in response to the first signal, wherein the second signal is in a-pulled down state in reference to the reference voltage when the first signal is in the first state, and wherein the second pull-up circuit is further configured to receive the second clock signals in order to provide the rear pulse in response to the second clock signals while the second signal is in the pulled down state.

The front-pulse generating part further comprises:

a second pull-down circuit configured to receive the second signal of the front-pulse generating part, wherein the pull-up circuit is connected to the second pull-down circuit in series such that the front pulse is provided in response to the first clock signals only when the second signal is in the pull-down state; and the rear-pulse generating part further comprises:

a second pull-down circuit configured to receive the second signal of the rear-pulse generating part, wherein the pull-up circuit is connected to the second pull-down circuit in series such that the rear pulse is provided in response to the second clock signals only when the second signal is in the pull-down state.

The front pulse has a pulse length equal to a clock period, the front pulse having a leading edge, and the front start pulse has a first edge leading a second edge, and wherein the leading edge of the front pulse is behind the first edge of the front start pulse by two pulse lengths, and the rear pulse has a leading edge and the rear start pulse has a first edge leading a second edge, wherein the first edge of the rear start pulse is behind the first edge of the front start pulse by two pulse lengths and the leading edge of the rear pulse is behind the first edge of the rear start pulse by two pulse lengths.

According to the present invention, the first pull-up circuit in the front-pulse generating part comprises a transistor having a gate terminal operatively connected to the source terminal for receiving the front start pulse, and a drain terminal for providing the first signal of the front-pulse generating part; and wherein the first pull-up circuit in the rear-pulse generating part comprises a transistor having a gate terminal connected to the source terminal for receiving the rear start pulse, and the drain terminal arranged for providing the first signal of the front-pulse generating part.

The second pull-up circuit in the front-pulse generating part comprises a transistor having a gate terminal arranged to receive the first signal of the front-pulse generating part, a source terminal arranged to receive the first clock signals and the drain terminal arranged for providing the front pulse at a first node, and the second pull-up circuit in the rear-pulse generating part comprises a transistor having a gate terminal arranged to receive the first signal of the rear-pulse generating part, a source terminal arranged to receive the second clock signals and a drain terminal for providing the rear pulse at a second node, wherein the first node is operatively connected to the second node for providing the front pulse and the rear pulse.

According to the present invention, the first pull-down circuit in the front-pulse generating part and the rear-pulse generating part comprises:

a capacitor having a first capacitor end arranged to receive the first clock signals, and a second capacitor end;

a first transistor having a gate terminal to the second capacitor end, a source terminal arranged to receive the first signal of the corresponding pulse generating part, and a drain terminal arranged to receive the reference voltage; and a second transistor having a gate terminal arranged to receive the first signal of the corresponding pulse generating part, a source terminal connected to the second capacitor end, and a drain terminal arranged to receive the reference voltage.

According to the present invention, the second pull-down circuit in the front-pulse generating part and the rear-pulse generating part comprises a transistor having a gate terminal arranged to receive the second signal of the corresponding pulse generating part, a source terminal connected to the output of the shift register and a drain terminal arranged to receive the reference voltage.

Each of the front-pulse generating part and the rear-pulse generating part further comprises a resetting circuit connected to the control end of the second pull-up circuit in the corresponding pulse generating part for causing the first signal of the corresponding pulse generating part to change from the first state to a different second state after the front-pulse or rear pulse is provided by the second pull-up circuit of the corresponding pulse generating part.

According to the present invention, the gate driver is connected to a timing control, such that the first-stage circuit is arranged to receive the front start pulse and the rear start pulse from the timing control, and wherein the timing control comprises:

a first pulse output for providing first pulse signals;

a second pulse output for providing second pulse signals having complementary phase relation with the first pulse signals;

a third pulse output for providing third pulse signals; and a fourth pulse output for providing fourth pulse signals having complementary phase relation with the third pulse signals. A shift register is arranged to receive the first pulse signals for providing the first clock signals in the front-pulse generating part and the third pulse signals for providing the second clock signals in rear-pulse generating part. In a next stage of the shift register series, the shift register is arranged to receive the second pulse signals for providing the first clock signals in the front-pulse generating part and the fourth pulse signals for providing the second clock signals in rear-pulse generating part.

Each shift register has a front carry buffer circuit for providing front start pulse to the next-stage shift register, and a rear carry buffer circuit for providing the rear start pulse to the next-stage shift register.

In the shift register, the transistors can be n-MOS transistors or p-MOS transistors. The first state of the first signal is HIGH and the second state is LOW for n-MOS transistors. The first state of the first signal is LOW and the second state is HIGH for p-MOS transistors.

It should be noted that, in the circuit as shown in FIG. 5, the carry buffer 56 is connected to the parallel pull-up circuit 54 in parallel so that the TFT M14 in the carry buffer 56 and the TMT M12 in the parallel pull-up circuit 54 are simultaneously in the conducting state when Q1 is high. As such, the clock pulse CK1 can be used as the front start pulse for the next-stage shift register. Alternatively, the front pulse X1_SR1 itself can also be used as the front start pulse IN1 for the next-stage shift register. Likewise, the rear pulse X2_SR1 in the rear pulse generating part in the current stage can also be used as the rear start pulse IN2 for the next-stage shift register.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. An electronic circuit for generating a signal pulse comprising a front pulse and a rear pulse in a non-overlapping manner in reference to a reference signal, said circuit comprising:
   a front-pulse generating part for generating the front pulse; and
   a rear-pulse generating part for generating the rear pulse, wherein
   the front-pulse generating part is configured to receive a front start pulse and a series of first clock signals, the front-pulse generating part comprising:
   a first pull-up circuit for providing a first signal in a first state in response to the front start pulse
   a second pull-up circuit to at least maintain the first signal in the first state; and
   a first pull-down circuit for providing a second signal in response to the first signal, wherein the second signal is in a pulled-down state in reference to the reference voltage when the first signal is in the first state, and wherein the second pull-up circuit is further configured to receive the first clock signals in order to provide the front pulse in response to the first clock signals while the second signal is in the pulled-down state; and wherein
   the rear-pulse generating part is configured to receive a rear start pulse and a series of second clock signals, the rear-pulse generating part comprising:
   a first pull-up circuit for providing a first signal in a first state in response to the rear start pulse
   a second pull-up circuit to at least maintain the first signal in the first state; and
   a first pull-down circuit for providing a second signal in response to the first signal, wherein the second signal is in a-pulled down state in reference to the reference voltage when the first signal is in the first state, and wherein the second pull-up circuit is further configured to receive the second clock signals in order to provide the rear pulse in response to the second clock signals while the second signal is in the pulled down state, wherein the rear start pulse follows the front start pulse such as to separate the rear pulse from the front pulse and wherein the front start pulse has a first pulse length and the rear start pulse has a second pulse length greater than the first pulse length.

2. The electronic circuit of claim 1, wherein the front-pulse generating part further comprises:
   a second pull-down circuit configured to receive the second signal of the front-pulse generating part, wherein the pull-up circuit is connected to the second pull-down circuit in series such that the front pulse is provided in response to the first clock signals only when the second signal is in the pull-down state; and
   wherein the rear-pulse generating part further comprises:
   a second pull-down circuit configured to receive the second signal of the rear-pulse generating parat, wherein the pull-up circuit is connected to the second pull-down circuit in series such that the rear pulse is provided in response to the second clock signals only when the second signal is in the pull-down state.

3. The electronic circuit of claim 2, wherein
   the front pulse has a pulse length equal to a clock period, the front pulse having a leading edge, and the front start pulse has a first edge leading a second edge, and wherein the leading edge of the front pulse is behind the first edge of the front start pulse by two pulse lengths, and
   the rear pulse has a leading edge and the rear start pulse has a first edge leading a second edge, wherein the first edge of the rear start pulse is behind the first edge of the front start pulse by two pulse lengths and the leading edge of the rear pulse is behind the first edge of the rear start pulse by two pulse lengths.

4. The electronic circuit of claim 1, wherein
   the first pull-up circuit in the front-pulse generating part comprises a switching element having a control end operatively connected to a first switch end for receiving the front start pulse, and a second switch end for providing the first signal of the front-pulse generating part; and wherein
   the first pull-up circuit in the rear-pulse generating part comprises a switching element having a control end operatively connected to a first switch end for receiving the rear start pulse, and a second switch end for providing the first signal of the front-pulse generating part.

5. The electronic circuit of claim 2, wherein
   the second pull-up circuit in the front-pulse generating part comprises a switching element having a control end arranged to receive the first signal of the front-pulse generating part, a first switch end arranged to receive the first clock signals and a second switch end for providing the front pulse at a first node, and wherein
   the second pull-up circuit in the rear-pulse generating part comprises a switching element having a control end arranged to receive the first signal of the rear-pulse generating part, a first switch end arranged to receive the second clock signals and a second switch end for providing the rear pulse at a second node, wherein the first node is operatively connected to the second node for providing the front pulse and the rear pulse.

6. The electronic circuit of claim 1, wherein
   the first pull-down circuit in the front-pulse generating part comprises:
   a capacitor having a first capacitor end arranged to receive the first clock signals, and a second capacitor end;
   a first switching element having a control end connected to the second capacitor end, a first switch end arranged to receive the first signal of the front-pulse generating part, and a second switch end arranged to receive the reference voltage; and a second switching element having a control end arranged to receive the first signal of the front-pulse generating part, a first switch end connected to the second capacitor end, and a second switch end arranged to received the reference voltage, and wherein the first pull-down circuit in the rear-pulse generating part comprises:

a capacitor having a first capacitor end arranged to receive the second clock signals, and a second capacitor end;

a first switching element having a control end connected to the second capacitor end, a first switch end arranged to receive the first signal of the rear-pulse generating part, and a second switch end arranged to receive the reference voltage, and a second switching element having a control end arranged to receive the first signal of the rear-pulse generating part, a first switch end connected to the second capacitor end, and a second switch end arranged to received the reference voltage.

7. The electronic circuit of claim 5, wherein the second pull-down circuit in the front-pulse generating part comprises a switching element having a control end arranged to receive the second signal of the front-pulse generating part, a first switch end connected to the first node and a second switch end arranged to receive the reference voltage; and wherein the second pull-down circuit in the rear-pulse generating part comprises a switching element having a control end arranged to receive the second signal of the rear-pulse generating part, a first switch end connected to the second node and a second switch end arranged to receive the reference voltage.

8. The electronic circuit of claim 5, wherein the front-pulse generating part further comprises a resetting circuit connected to the control end of the second pull-up circuit in the front-pulse generating part for causing the first signal of the front-pulse generating part to change from the first state to a different second state after the front-pulse is provided by the second pull-up circuit of the front-pulse generating part; and the rear-pulse generating part further comprises a resetting circuit connected to the control end of the second pull-up circuit in the rear-pulse generating part for causing the first signal of the rear-pulse generating part to change from the first state to a different second state after the rear-pulse is provided by the second pull-up circuit of the rear-pulse generating part.

9. The electronic circuit of claim 8, wherein when the first signal of the front-pulse generating part is in the second state, the first signal has a voltage level equal to the reference voltage, and when the first signal of the front-pulse generating part is in the first state, the first signal has a voltage level higher than the reference voltage; and when the first signal of the rear-pulse generating part is in the second state, the first signal has a voltage level equal to the reference voltage, and when the first signal of the rear-pulse generating part is in the first state, the first signal has a voltage level higher than the reference voltage.

10. A gate driver for use in a liquid crystal display, the liquid crystal display comprising a plurality of pixels arranged in a plurality of rows, the gate driver comprising a plurality of the gate-line generating circuits connected in series, each of gate-line generating circuits arranged to provide a gate signal pulse to each of the plurality of rows, wherein the gate-line generating circuits comprises a first-stage circuit, a second-stage circuit and a third-stage circuit, and wherein each of the gate-line generating circuits comprises an electronic device of claim 1.

11. The gate driver of claim 10, wherein the gate driver is connected to a timing control, such that the first-stage circuit is arranged to receive the front start pulse and the rear start pulse from the timing control, and wherein the timing control comprises:

a first pulse output for providing first pulse signals;

a second pulse output for providing second pulse signals having complementary phase relation with the first pulse signals;

a third pulse output for providing third pulse signals; and a fourth pulse output for providing fourth pulse signals having complementary phase relation with the third pulse signals; and wherein the first-stage circuit is arranged to receive the first pulse signals for providing the first clock signals in the electronic device in the first-stage circuit and the third pulse signals for providing the second clock signals in the electronic device in the first-stage circuit, the first-stage circuit further comprising:

a first front carry buffer circuit comprising a switching element having a control end arranged to receive the first signal in the corresponding front-pulse generating part, a first switch end arranged to receive the first clock signals and a second switch end for providing the front start pulse to the second-stage circuit, and a first rear carry buffer circuit comprising a switching element having a control end arranged to receive the first signal in the corresponding rear-pulse generating part, a first switch end arranged to receive the second clock signals and a second switch end for providing the rear start pulse to the second-stage circuit;

the second-stage circuit is arranged to receive the second pulse signals for providing the first clock signals in the electronic device in the second-stage circuit and the fourth pulse signals for providing the second clock signals in the electronic device in the second-stage circuit, the second-stage circuit further comprising:

a second front carry buffer circuit comprising a switching element having a control end arranged to receive the first signal in the corresponding front-pulse generating part, a first switch end arranged to receive the first clock signals and a second switch end for providing the front start pulse to the third-stage circuit, and a second rear carry buffer circuit comprising a switching element having a control end arranged to receive the first signal in the corresponding rear-pulse generating part, a first switch end arranged to receive the second clock signals and a second switch end for providing the rear start pulse to the third-stage circuit; and the third-stage circuit is arranged to receive the first pulse signals for providing the first clock signals in the electronic device in the third-stage circuit and the third pulse signals for providing the second clock signals in the electronic device in the third-stage circuit, the first-stage circuit further comprising:

a first front carry buffer circuit comprising a switching element having a control end arranged to receive the first signal in the corresponding front-pulse generating part, a first switch end arranged to receive the first clock signals and a second switch end for providing the front start pulse to a fourth-stage circuit, and a first rear carry buffer circuit comprising a switching element having a control end arranged to receive the first signal in the corresponding rear-pulse generating part, a first switch end arranged to receive the second clock signals and a second switch end for providing the rear start pulse to a fourth-stage circuit.

12. A liquid crystal display comprising a plurality of pixels arranged in a plurality of rows, said display comprising:
a gate driver comprising a plurality of the gate-line generating circuits connected in series, each of gate-line generating circuits arranged to provide a gate signal pulse to each of the plurality of rows, wherein each of the gate-line generating circuits comprises an electronic device of claim 1.

13. A method for generating gate-line signals for use in liquid crystal display comprising a plurality of pixels arranged in a plurality of rows, each row arranged to receive a gate signal pulse which comprises a front pulse and a rear pulse in a non-overlapping manner in reference to a reference voltage, said method comprising:
providing a front start pulse;
generating a first front signal in a first state in response to the front start pulse,
generating a second front signal in response to the first front signal, wherein the second front signal is in a pulled-down state in reference to the reference voltage when the first front signal is in the first state,
receiving a first clock signal for providing the front pulse while the second front signal is in the pulled-down state;
providing a rear start pulse following the front start pulse and separate from the front start pulse, wherein the front start pulse has a first pulse length and the rear start pulse has a second pulse length greater than the first pulse length;
generating a first rear signal in the first state in response to the rear start pulse,
generating a second rear signal in response to the first rear signal, wherein the second rear signal is in a pulled-down state in reference to the reference voltage when the first rear signal is in the first state, and
receiving a second clock signal for providing the rear pulse while the second rear signal is in the pulled-down state.

14. The method of claim 13, further comprising:
causing the first front signal to change from the first state to a second state after the front pulse is provided; and
causing the first rear signal to change from the first state to a second state after the rear pulse is provided.

15. The method of claim 13, wherein
the front pulse has a pulse length equal to a clock period, the front pulse having a leading edge, and the front start pulse has a first edge leading a second edge, and wherein the leading edge of the front pulse is behind the first edge of the front start pulse by two pulse lengths, and
the rear pulse has a leading edge and the rear start pulse has a first edge leading a second edge, wherein the first edge of the rear start pulse is behind the first edge of the front start pulse by two pulse lengths and the leading edge of the rear pulse is behind the first edge of the rear start pulse by two pulse lengths.

* * * * *

UNITED STATES PATENT AND TRADEMARK OFFICE
CERTIFICATE OF CORRECTION

PATENT NO. : 7,872,506 B2
APPLICATION NO. : 12/291006
DATED : January 18, 2011
INVENTOR(S) : Chih Yuan Chien and Tsung-Ting Tsai It is certified that error appears in the above-identified patent and that said Letters Patent is hereby corrected as shown below:

In Column 14, line 15, (claim 2, line 11) the word "parat" should be "part".

Signed and Sealed this
Third Day of May, 2011

David J. Kappos
*Director of the United States Patent and Trademark Office*